United States Patent
Kim

(10) Patent No.: US 9,042,113 B2
(45) Date of Patent: May 26, 2015

(54) PRINTED CIRCUIT BOARD AND METHOD OF MANUFACTURING THE SAME

(71) Applicant: Samsung Electro-Mechanics Co., Ltd., Gyunggi-do (KR)

(72) Inventor: Joon Sung Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 149 days.

(21) Appl. No.: 13/682,505

(22) Filed: Nov. 20, 2012

(65) Prior Publication Data
US 2013/0126224 A1    May 23, 2013

(30) Foreign Application Priority Data
Nov. 23, 2011    (KR) .................. 10-2011-0123151

(51) Int. Cl.
| | | |
|---|---|---|
| *H05K 7/00* | (2006.01) | |
| *H05K 1/11* | (2006.01) | |
| *H05K 3/06* | (2006.01) | |
| *H05K 3/40* | (2006.01) | |
| *H05K 3/34* | (2006.01) | |
| *H05K 3/46* | (2006.01) | |

(52) U.S. Cl.
CPC .. *H05K 1/11* (2013.01); *H05K 3/06* (2013.01); *H05K 3/4038* (2013.01); *H05K 3/3452* (2013.01); *H05K 3/4007* (2013.01); *H05K 3/4661* (2013.01); *H05K 2201/0376* (2013.01); *H05K 2203/1476* (2013.01)

(58) Field of Classification Search
USPC .......... 361/760, 761, 764, 767; 174/260, 262
See application file for complete search history.

(56) References Cited

U.S. PATENT DOCUMENTS

| | | | | |
|---|---|---|---|---|
| 7,763,982 | B2 * | 7/2010 | Liao .............................. | 257/777 |
| 7,968,991 | B2 * | 6/2011 | Wong et al. .................... | 257/686 |
| 2006/0023439 | A1 * | 2/2006 | Fraley et al. .................. | 361/780 |
| 2007/0075435 | A1 * | 4/2007 | Suminoe et al. ............... | 257/777 |
| 2010/0000775 | A1 * | 1/2010 | Shen et al. ..................... | 174/260 |
| 2010/0140800 | A1 * | 6/2010 | Hagihara ....................... | 257/737 |
| 2011/0156251 | A1 * | 6/2011 | Chu et al. ....................... | 257/738 |
| 2012/0188735 | A1 * | 7/2012 | Hiroshima et al. ........... | 361/767 |

FOREIGN PATENT DOCUMENTS

| | | |
|---|---|---|
| KR | 10-2007-0109264 | 11/2007 |
| KR | 1020070109042 | 11/2007 |
| KR | 10-2011-0083984 | 7/2011 |

OTHER PUBLICATIONS

Office Action for Korean Patent Application No. 10-2011-0123151, dated Nov. 15, 2012, and its English translation.

* cited by examiner

*Primary Examiner* — Hoa C Nguyen
(74) *Attorney, Agent, or Firm* — Ladas & Parry, LLP

(57) ABSTRACT

Disclosed herein are a printed circuit board and a method of manufacturing the same. The printed circuit board includes: a base substrate; an outer circuit layer formed on an upper portion of the base substrate and including a connection pad; a first solder resist formed on the upper portion of the base substrate so that the connection pad of the outer circuit layer is exposed; and a second solder resist formed on an upper portion of an outer circuit layer and formed so that the connection pad is exposed.

5 Claims, 8 Drawing Sheets

PRINTED CIRCUIT BOARD AND METHOD OF MANUFACTURING THE SAME

CROSS REFERENCE TO RELATED APPLICATION

This application claims the benefit of Korean Patent Application No. 10-2011-0123151, filed on Nov. 23, 2011, entitled "Printed Circuit Board and Method of Manufacturing a Printed Circuit Board", which is hereby incorporated by reference in its entirety into this application.

BACKGROUND OF THE INVENTION

1. Technical Field

The present invention relates to a printed circuit board and a method of manufacturing the same.

2. Description of the Related Art

In accordance with the development of electronic industry, the demand for multi-functionalization, thinness, densification, and competitive cost of an electronic component has rapidly increased. In accordance with the thinness and the densification of the electronic component, a printed circuit board mounted in the electronic component has also become thin. Due to the thinness of the printed circuit board, a pitch of a circuit pattern of the printed circuit board has also become small. In order to form a circuit pattern having a fine pitch, a semi-additive process (SAP) may be used. The SAP method is a method of forming a circuit pattern by forming a palladium (Pd) catalyst in an insulating material and then performing electroless plating and electroplating. (Korean Patent Laid-Open Publication No. 2007-0109042) However, a case in which the palladium catalyst is not completely removed is often generated. In this case, at the time of gold plating for surface treatment, a phenomenon that the gold plating is spread may be generated due to the palladium catalyst that is not removed.

SUMMARY OF THE INVENTION

The present invention has been made in an effort to provide a printed circuit board preventing a phenomenon that gold plating is spread due to palladium at the time of surface treatment, and a method of manufacturing the same.

According to a preferred embodiment of the present invention, there is provided a printed circuit board including: a base substrate; an outer circuit layer formed on an upper portion of the base substrate and including a connection pad; a first solder resist formed on the upper portion of the base substrate so that the connection pad of the outer circuit layer is exposed; and a second solder resist formed on an upper portion of an outer circuit layer and formed so that the connection pad is exposed.

The printed circuit board may further include an inner circuit layer formed between the upper portion of the base substrate and a lower portion of the outer circuit layer.

The inner and outer circuit layers may be formed on both surfaces of the base substrate.

The base substrate may include a penetration via electrically interconnecting the inner circuit layers formed on the both surfaces thereof.

The connection pad may include a semiconductor device mounted thereon or electrically connected thereto.

The connection pad may include a solder bump formed on an upper portion thereof.

In the connection pad, wire bonding may be performed.

According to another preferred embodiment of the present invention, there is provided a method of manufacturing a printed circuit board, the method including: preparing a base substrate including an inner circuit layer; forming an outer circuit layer on an upper portion of the base substrate, the outer circuit layer including a connection pad; forming a first solder resist on an upper portion of the outer circuit layer so that the outer circuit layer is exposed; and forming a second solder resist on the upper portion of the outer circuit layer so that the connection pad is exposed.

The preparing of the base substrate including the inner circuit layer may include: preparing the base substrate including a first insulating layer and metal layers stacked on both surfaces of the first insulating layer; removing the metal layer from the both surfaces of the first insulating layer; performing desmear on the surface of the first insulating layer from which the metal layer is removed; forming a first seed layer on the surface of the first insulating layer on which the desmear is performed, using electroless plating; forming a first plating resist on an upper portion of the first seed layer, the first plating resist having opening parts patterned at predetermined positions at which the inner circuit layer is to be formed; performing electroplating; removing the first plating resist; and etching the exposed first seed layer through flash etching.

The method may further include, after the preparing of the base substrate including the first insulating layer and the metal layers stacked on both surfaces of the first insulating layer, forming a penetration via hole in the base substrate.

The performing of the electroplating to form the inner circuit layer may include performing the electroplating in the penetration via hole to form a penetration via for electrical conduction between layers.

The forming of the outer circuit layer may include: forming an outer insulating layer on upper portions of the base substrate and the inner circuit layer; forming a first metal layer on an upper portion of the outer insulating layer; forming a blind via hole in the outer insulating layer on which the first metal layer is formed; removing the first metal layer formed on the outer insulating layer; forming a second seed layer on the upper portion of the outer insulating layer and on an inner wall of the blind via hole; forming a second plating resist on an upper portion of the second seed layer, the second plating resist having opening parts patterned at predetermined positions at which the outer circuit layer is to be formed; performing electroplating; removing the second plating resist; and etching the exposed second seed layer through flash etching.

In the forming of the first solder resist, the first solder resist may be sprayed on the upper portion of the outer insulating layer in a spray scheme so that the outer circuit layer is exposed.

The forming of the first solder resist may include: applying the first solder resist on the upper portions of the outer insulating layer and the outer circuit layer; and polishing the applied first solder resist so that the outer circuit layer is exposed.

The method may further include, after the forming of the second solder resist, forming a solder bump on an upper portion of the exposed connection pad.

The method may further include, after the forming of the second solder resist, performing wire bonding on the exposed connection pad.

DESCRIPTION OF THE PREFERRED EMBODIMENTS

Figure 1:
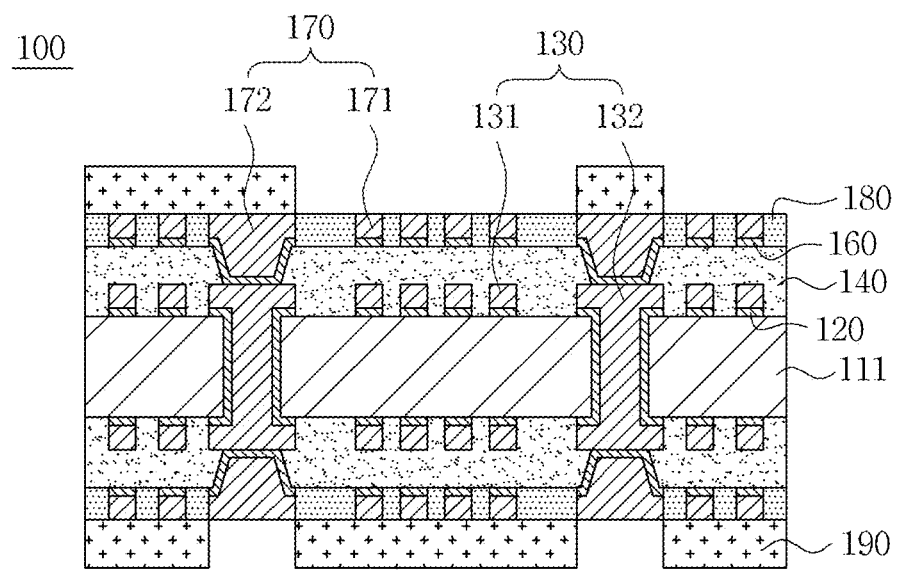
FIG. 1 is a view showing a printed circuit board according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings.

Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, a printed circuit board and a method of manufacturing the same according to a preferred embodiment of the present invention will be described in detail with reference to the accompanying drawings.

Printed Circuit Board

FIG. 1 is a view showing a printed circuit board according to a preferred embodiment of the present invention.

The printed circuit board 100 may be configured to include a base substrate 110, an inner circuit layer 130, a second insulating layer 140, an outer circuit layer 170, a first solder resist 180, and a second solder resist 190.

The base substrate 110 may be formed of a hard material capable of supporting a built-up printed circuit board. For example, the base substrate 110 may be formed of a metal plate or an insulating material. Here, the metal plate may be a copper foil, and the insulating material may be a complex polymer resin. Alternatively, the base substrate 110 is formed of an Ajinomoto build up film (ABF), such that a fine circuit may be easily implemented, or is formed of prepreg, such that a thin printed circuit board may be manufactured. The base substrate 110 may be formed of a hard insulating material including, but being not limited to, an epoxy resin or a modified epoxy resin, a bisphenol A resin, an epoxy-novolak resin, or an aramid reinforced or glass fiber reinforced or paper reinforced epoxy resin. The base substrate 110 according to the preferred embodiment of the present invention may have a structure in which metal layers 112 and 113 are stacked on both surfaces of a first insulating layer 111 formed of an insulating material. In addition, according to the preferred embodiment of the present invention, the base substrate 110 may be formed so as to be penetrated by a penetration via 132.

The inner circuit layer 130 may be formed on an upper portion of the base substrate 110. The inner circuit layer 130 may include an inner circuit pattern 131 and the penetration via 132. Here, the penetration via 132 may be formed to penetrate through the base substrate 110 to thereby electrically interconnect both sides of the base substrate 110. The inner circuit layer 130 may be formed of a metal having electrical conductivity. According to the preferred embodiment of the present invention, the inner circuit layer 130 may be formed of copper. However, it is obvious to those skilled in the art that a case in which the inner circuit layer 130 is formed of copper is only an example and the present invention is not limited thereto.

The second insulating layer 140 may be formed on an upper portion of the inner circuit layer 130. The second insulating layer 140 may be formed in a shape in which it buries the inner circuit layer 130. The second insulating layer 140 may be formed of a general epoxy based resin or fluorinated resin.

The outer circuit layer 170 may be formed on an upper portion of the second insulating layer 140. The outer circuit layer 170 may include an outer circuit pattern 171 and a blind via 172. Here, the outer circuit pattern 171 may support an external device such as a semiconductor chip, or the like, and include an electrically connected connection pad. In addition, the blind via 172 may be formed to electrically interconnect the outer circuit layer 170 and the inner circuit layer 130. As shown in FIG. 1, the blind via 172 may be formed on an upper portion of the penetration via 132. However, a position of the blind via 172 is not limited thereto, but may be variously changed by those skilled in the art.

The first solder resist 180 may be formed on an upper portion of the second insulating layer 140. The first solder resist 180 is formed on the upper portion of the second insulating layer 140, but is not formed on an upper portion of the outer circuit layer 170. That is, the first solder resist 180 may be formed on the upper portion of the second insulating layer 140 at which the outer circuit layer 170 is not formed.

The second solder resist 190 may be formed on an upper portion of the first solder resist 180 or the outer circuit layer 170. For example, the second solder resist 190 may be formed on the upper portions of the first solder resist 180 and the outer circuit layer 170 and be formed so that an upper portion of the outer circuit pattern 171, which is a connection pad, in the outer circuit layer 170 is exposed.

Method of Manufacturing Printed Circuit Board

FIGS. 2 to 21 are views showing a method of manufacturing a printed circuit board according to the preferred embodiment of the present invention.

Figure 2:
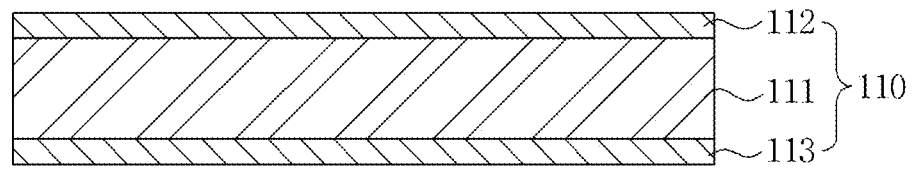
FIGS. 2 to 20 are views showing a method of manufacturing a printed circuit board according to the preferred embodiment of the present invention.

Referring to FIG. 2, a base substrate 110 is provided.

The base substrate 110 may be formed of a hard material capable of supporting a built-up printed circuit board. For example, the base substrate 110 may be formed of a metal plate or an insulating material. Here, the metal plate may be a copper foil, and the insulating material may be a complex polymer resin. Alternatively, the base substrate 110 may be formed of an Ajinomoto build up film (ABF) to easily implement a fine circuit or may be formed of prepreg to manufacture a thin printed circuit board. The base substrate 110 may be formed of a hard insulating material including, but being not limited to, an epoxy resin or a modified epoxy resin, a bisphenol A resin, an epoxy-novolak resin, or an aramid reinforced or glass fiber reinforced or paper reinforced epoxy resin. The base substrate 110 according to the preferred embodiment of the present invention may have a structure in which metal layers 112 and 113 are stacked on both surfaces of a first insulating layer 111 formed of an insulating material.

Figure 3:
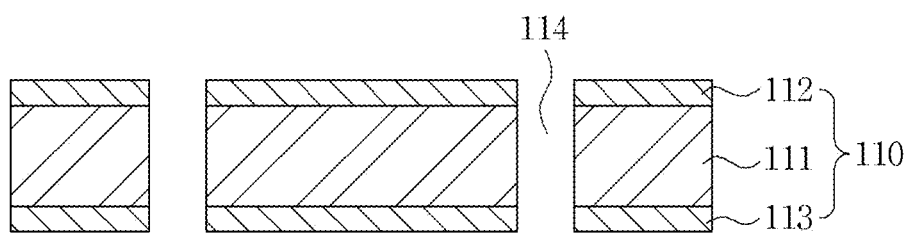

Referring to FIG. 3, a penetration via hole 114 is formed in the base substrate 110.

The number of penetration via holes 114, which is a through-hole for electrical conduction between layers, may be one or more. The penetration via hole 114 may be formed by performing a general etching and process on the base substrate 110.

Figure 4:
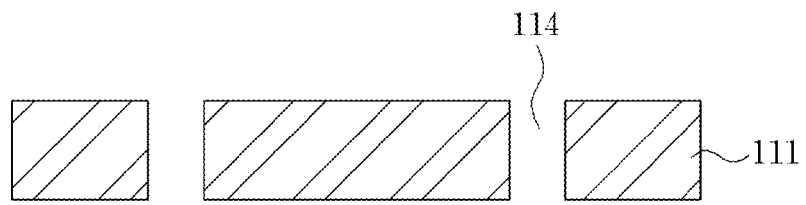

Referring to FIG. 4, metal layers 112 and 113 are removed from the base substrate 110.

The metal layers 112 and 113 formed on both surfaces of the base substrate 110 may be removed. Here, the metal layers 112 and 113 formed on both surfaces of the base substrate 110 may be removed by a general full etching method.

Figure 5:
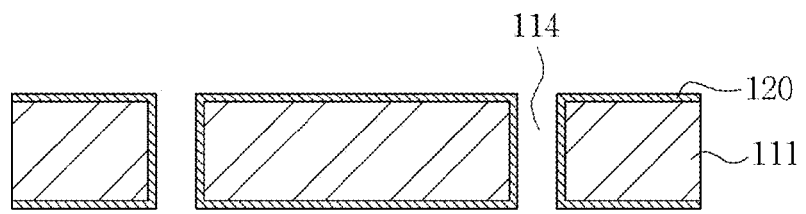

Referring to FIG. 5, a first seed layer 120 may be formed on the base substrate 110. The first seed layer 120 may be formed on the base substrate 110 in which the penetration via hole 114 is formed and the metal layers 112 and 113 are formed on both surfaces by an electroless plating method. The first seed layer 120 may be formed of a conductive metal. For example, the first seed layer 120 may be formed of copper.

Here, the electroless plating method will be briefly described. The electroless plating may be based on the principle of adsorbing (in the case of non-metal) or substituting for (in the case of metal) palladium, which is a catalyst, on a surface (a first insulating layer in the present invention) to coat the palladium on the surface and then receiving an electrode from a reducing agent, which is a constituent of an electroless plating solution, to precipitate copper.

Figure 6:
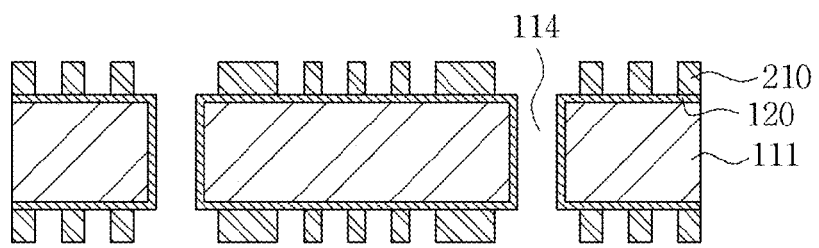

Referring to FIG. 6, a first plating resist 210 may be formed on an upper portion of the first seed layer 120. The first plating resist 210 may be formed at a predetermined portion except for a portion at which a circuit pattern is plated later. For example, the first plating resist 210 may be formed of a dry film.

Figure 7:
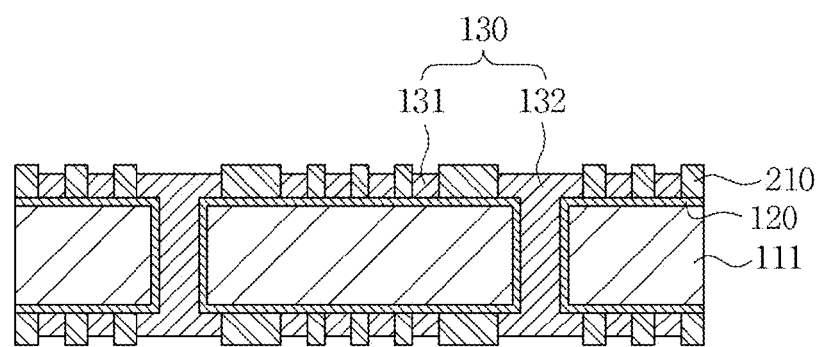

Referring to FIG. 7, an inner circuit layer 130 may be formed on the base substrate 110.

The inner circuit layer 130 may be formed at a portion at which the first plating resist 210 is not formed. A method of forming the inner circuit layer 130 is not particularly limited, but may be a general method. For example, the inner circuit layer 130 may be formed by performing electroplating. The inner circuit layer 130 may be formed of a conductive metal, for example, at least one of gold, silver, nickel, aluminum, copper, and an alloy thereof. The inner circuit layer 130 may include an inner circuit pattern 131 and a penetration via 132. Here, the penetration via hole 114 formed in the base substrate 110 may also be plated to form the penetration via 132. Alternatively, the penetration via 132 may also be formed before the electroplating is performed. That is, the penetration via 132 may be formed by filling the penetration via hole 114 with a general conductive metal paste and performing the electroplating.

Figure 8:
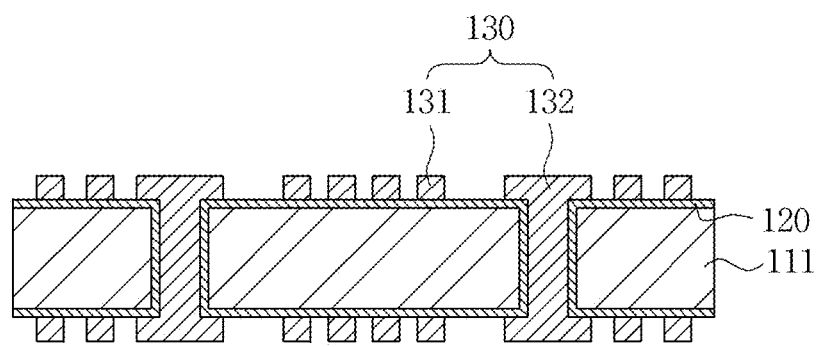

Referring to FIG. 8, the first plating resist 210 may be removed.

The first plating resist 210 is removed, such that the first seed layer 120 may be exposed.

Figure 9:
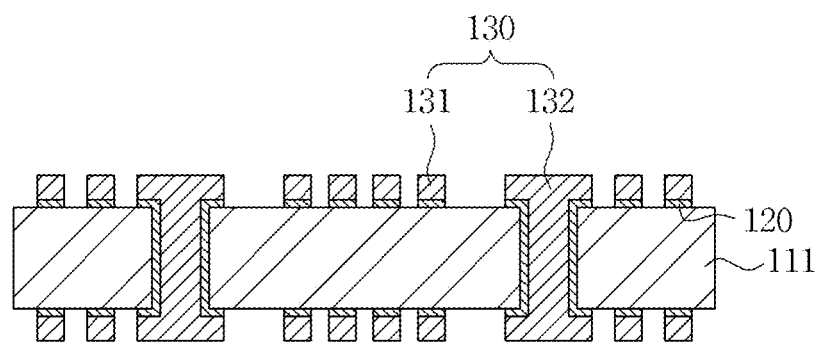

Referring to FIG. 9, the first seed layer 120 may be removed.

The first seed layer 120 exposed by removing first plating resist 210 may be removed by a general flash etching method.

Figure 10:
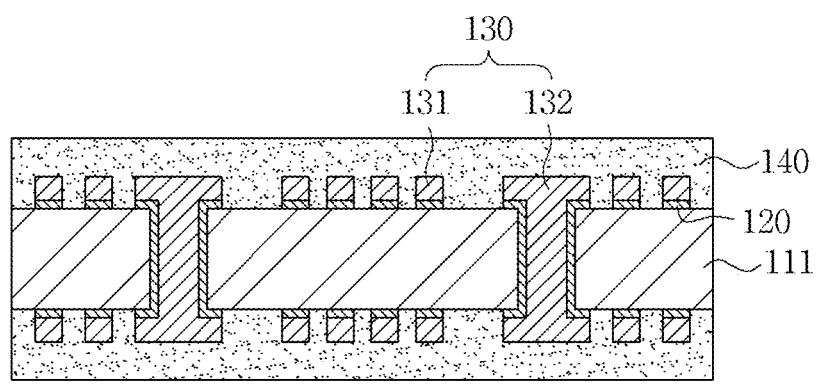

Referring to FIG. 10, a second insulating layer 140 may be formed on the inner circuit layer 130. The second insulating layer 140 may be formed on the base substrate 110 and the inner circuit layer 130. The second insulating layer 140 may be formed of a general epoxy based resin or fluorinated resin.

Figure 11:
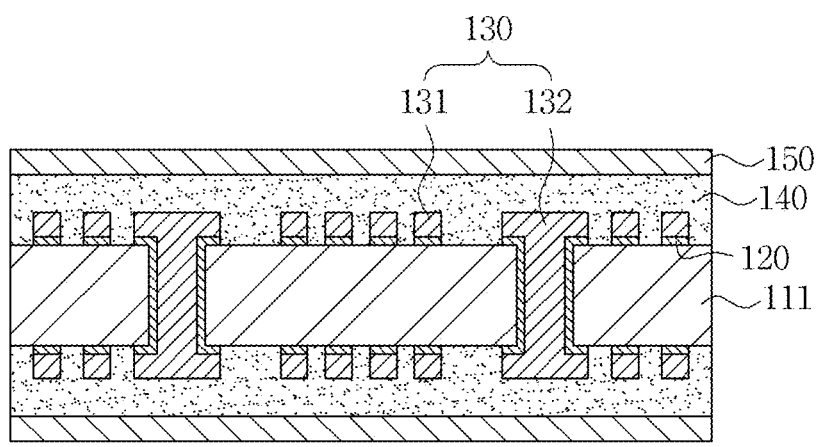

Referring to FIG. 11, a metal film 150 may be formed on an upper portion of the second insulating layer 140. Since the metal film 150 has an adhesive material applied to one surface thereof, it may be formed by being adhered to the upper portion of the second insulating layer 140. In addition, the metal film 150 may be formed on the upper portion of the second insulating layer 140 by a method such as a sputtering method, a spray applying method, or the like.

The metal film 150 may be formed of copper. However, a material of the metal film 150 is not limited thereto, but may be variously changed and applied as needed in a design.

Figure 12:
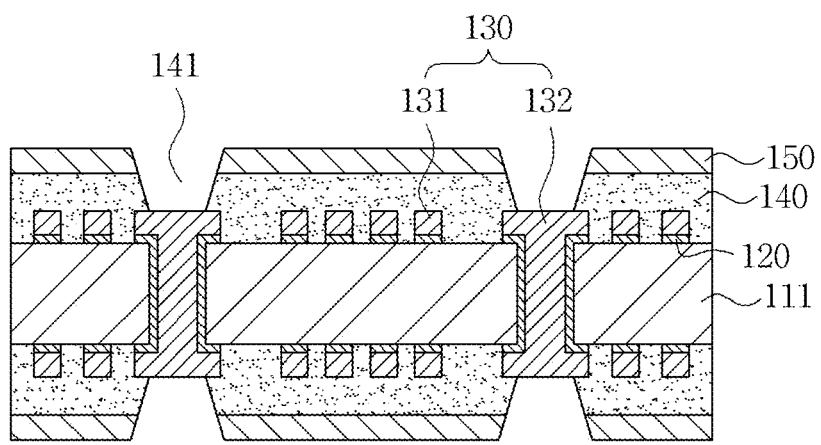

Referring to FIG. 12, a blind via hole 141 may be formed in the second insulating layer 140 to which the metal film 150 is adhered. The blind via hole 141 is formed with a blind via for electrically conducting the inner circuit layer 130 and an outer circuit layer to be formed later to each other. According to the preferred embodiment of the present invention, the blind via hole 141 may be formed so that the penetration via 132 is exposed. The blind via hole 141 may be formed using a mechanical drill, a laser drill, or the like.

Figure 13:
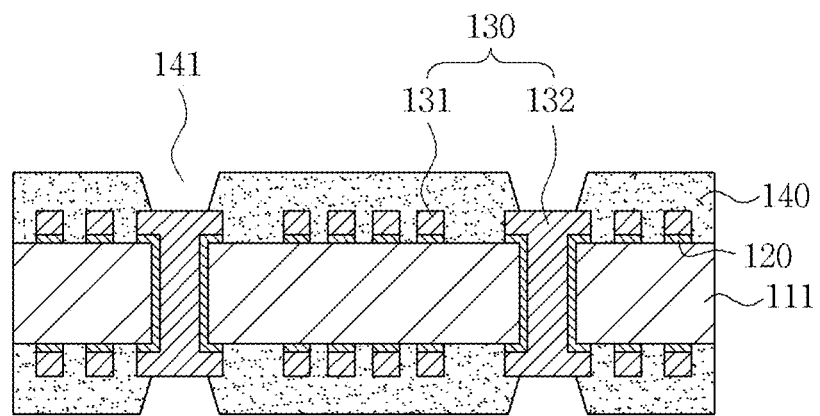

Referring to FIG. 13, the metal film 150 formed on the second insulating layer 140 may be removed.

When the metal film 150 is adhered in a film form, the metal film 150 may be removed by a method of tearing off the metal film 150. Alternatively, the metal film 150 may be removed through etching or polishing.

Figure 14:
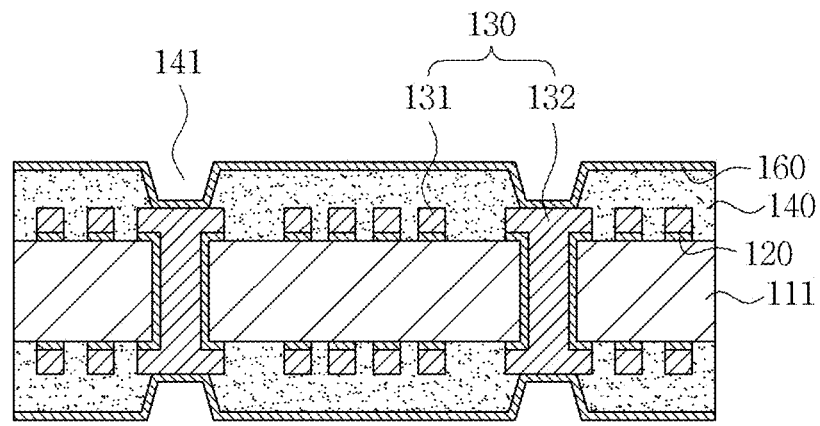

Referring to FIG. 14, a second seed layer 160 may be formed on the second insulating layer 140. The second seed layer 160 may be formed on upper portions of the second insulating layer 140, an outer wall of the blind via hole 141, and the exposed penetration via 132. The second seed layer 160 may be formed by performing electroless plating using a conductive metal such as copper, or the like. That is, the second seed layer 160 may be formed by adsorbing palladium, which is a catalyst, on a surface of the second insulating layer 140 to coat the palladium on the surface and then receiving an electrode from a reducing agent, which is a constituent of an electroless plating solution, to precipitate copper.

Figure 15:
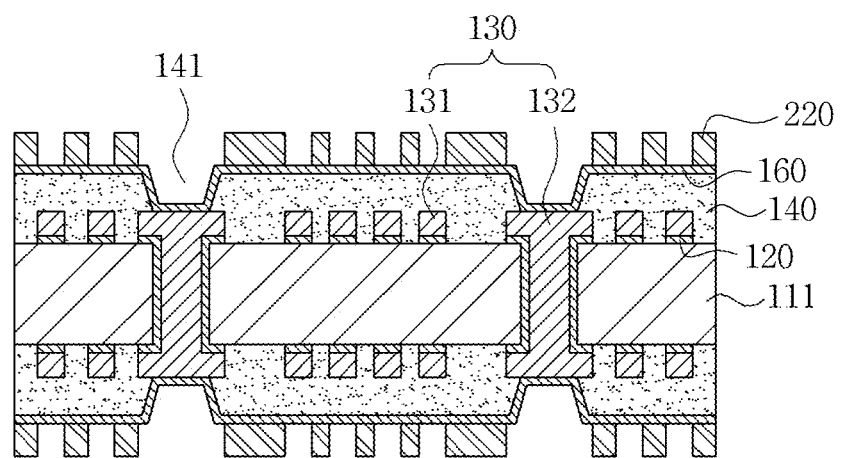

Referring to FIG. 15, a second plating resist 220 may be formed on an upper portion of the second seed layer 160. The second plating resist 220 may be formed at a predetermined portion except for a portion at which a circuit pattern is plated later. For example, the second plating resist 220 may be formed of a dry film.

Figure 16:
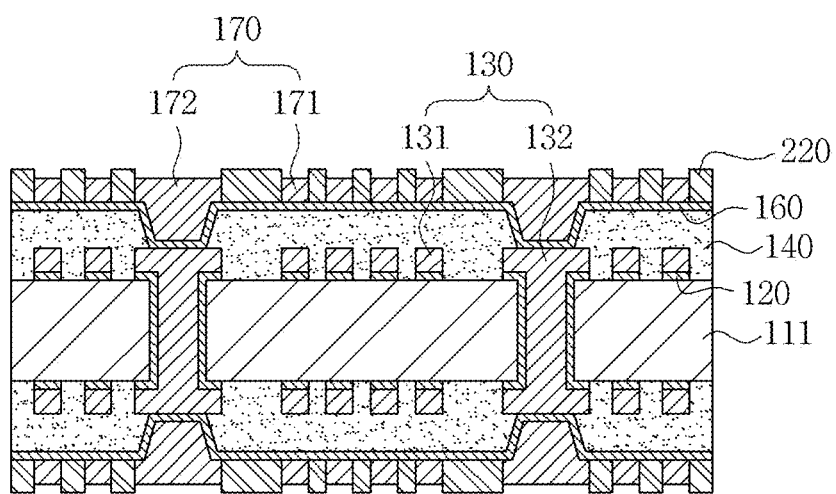

Referring to FIG. 16, an outer circuit layer 170 may be formed on an upper portion of the second seed layer 160.

A method of forming the outer circuit layer 170 is not particularly limited, but may be a general method. For example, the outer circuit layer 170 may be formed by performing electroplating. The outer circuit layer 170 may be formed of a conductive metal, for example, at least one of gold, silver, nickel, aluminum, copper, and an alloy thereof. The outer circuit layer 170 may include an outer circuit pattern 171 including a connection pad and a blind via 172. Here, the blind via hole 141 formed in the second insulating layer 140 may also be plated to form the blind via 172. The connection pad is a place in which bump forming or wire bonding is performed so as to support a semiconductor chip to be mounted on the printed circuit board or be electrically connected to the outer circuit layer 170.

Figure 17:
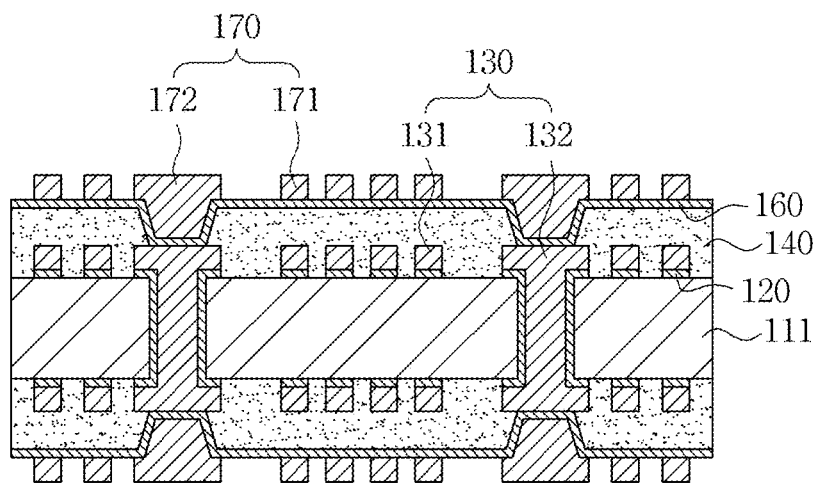

Referring to FIG. 17, the second plating resist 220 may be removed.

The second plating resist 220 is removed, such that the second seed layer 160 may be exposed.

Figure 18:
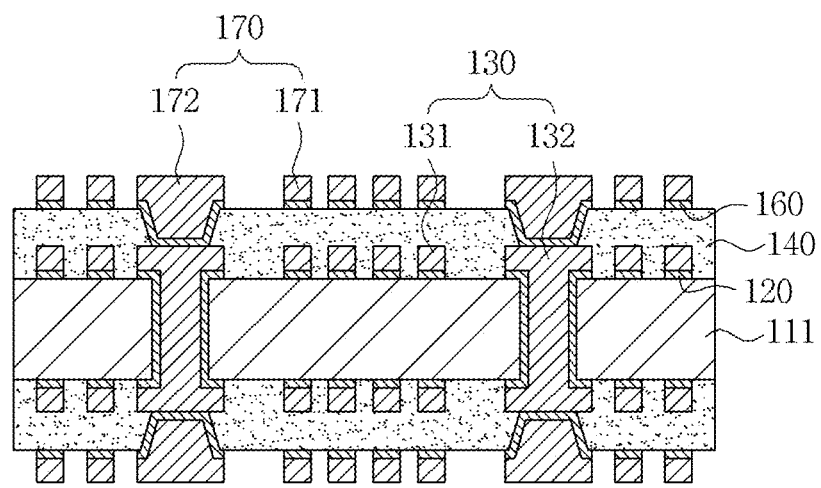

Referring to FIG. 18, the second seed layer 160 may be removed.

The second seed layer 160 exposed by removing second plating resist 220 may be removed by a general flash etching method. Here, the second seed layer 160 may not be completely removed. Alternatively, the palladium component coated in order to form the second seed layer 160 may remain on an upper portion of the second insulating layer 140 without being completely removed.

Figure 19:
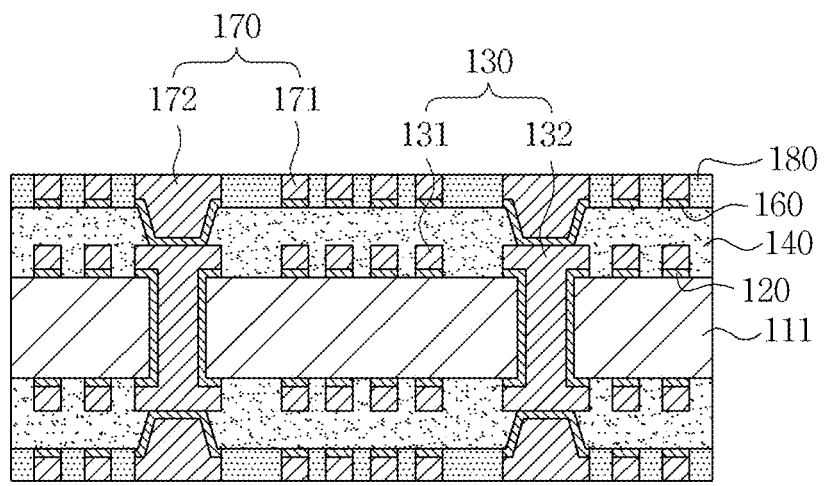

Referring to FIG. 19, a first solder resist 180 may be formed.

First, the first solder resist 180 may be applied over the entire upper portions of the second insulating layer 140 and the outer circuit layer 170. Then, through a polishing process, the first solder resist 180 may be formed so that it remains only on the upper portion of the second insulating layer 140 at which the outer circuit layer 170 is not formed. Alternatively, through a patterned mask, the first solder resist 180 may be formed only on the second insulating layer 140 at which the outer circuit layer 170 is not formed. Alternatively, the first solder resist 180 may be formed in a spray scheme, or the like. A method of forming the first solder resist 180 only on the second insulating layer 140 except for the outer circuit layer 170 is not limited, but may be changed and selected by those skilled in the art. That is, the first solder resist 180 may also be applied to the second insulating layer 140 in the vicinity of the connection pad connected to an external device such as a semiconductor chip in the outer circuit layer. Therefore, when gold plating for surface treatment of the connection pad, which is the outer circuit layer 170, is performed later, a phenomenon that the gold plating is spread due to the palladium component present on the second insulating layer may be prevented.

Figure 20:
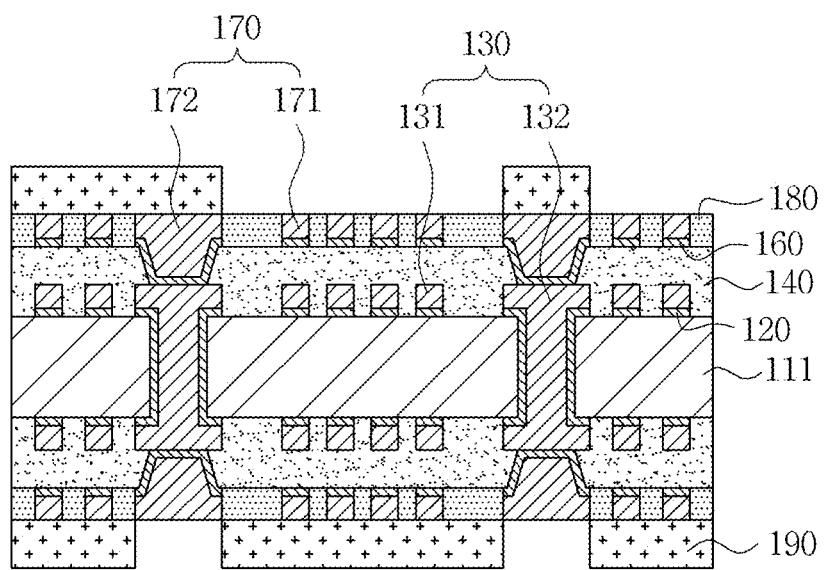

Referring to FIG. 20, a second solder resist 190 may be formed.

According to the preferred embodiment of the present invention, the second solder resist 190 may be formed so that the outer circuit pattern 171, which is the connection pad, is exposed. A method of forming the second solder resist 190 is not limited, but may be changed and selected by those skilled in the art. After the second solder resist 190 is formed as described above, surface treatment through the gold plating may be performed on an upper portion of the outer circuit pattern 171, which is the connection pad. Here, the surface treatment is not limited to the gold plating. In addition, a method of performing the surface treatment and a material used for the surface treatment may be the same as a method and a material used in the prior art. The second solder resist 190 may be formed of a general solder resist material. In addition, the second solder resist 190 may be formed of the same material as or a material different from that of the first solder resist 180.

With the printed circuit board and the method of manufacturing a printed circuit board according to the preferred embodiments of the present invention, the first solder resist may be formed in the vicinity of the connection pad of the outer circuit layer, and the second solder resist may be formed on the upper portion of the outer circuit layer. A gold plating spread phenomenon generated at the time of gold plating for surface treatment of the connection pad due to the palladium remaining on the insulating layer in the vicinity of the connection pad may be prevented by the first solder resist formed as described above.

As set forth above, with the printed circuit board and the method of manufacturing a printed circuit board according to the preferred embodiments of the present invention, the phenomenon that the gold plating is spread due to the palladium at the time of the surface treatment may be prevented using the first and second solder resists.

Although the embodiment of the present invention has been disclosed for illustrative purposes, it will be appreciated that a printed circuit board and a method of manufacturing the same according to the invention are not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A printed circuit board comprising:
    a base substrate;
    an outer circuit layer having a plurality of outer circuit patterns, the outer circuit layer being formed on an upper portion of the base substrate, and the plurality of outer circuit patterns including a plurality of connection pads;
    a first solder resist formed spaces between the plurality of outer circuit patterns excluding upper portions of the plurality of outer circuit patterns; and
    a second solder resist formed on an upper portion of the outer circuit layer and formed so that the plurality of connection pads are exposed.

2. The printed circuit board as set forth in claim 1, further comprising an inner circuit layer formed between the upper portion of the base substrate and a lower portion of the outer circuit layer.

3. The printed circuit board as set forth in claim 2, wherein the inner and outer circuit layers are formed on both surfaces of the base substrate.

4. The printed circuit board as set forth in claim 3, wherein the base substrate includes a penetration via electrically interconnecting the inner circuit layers formed on the both surfaces thereof.

5. The printed circuit board as set forth in claim 1, further comprising solder bumps formed on upper portions of the plurality of connection pads.

* * * * *